US008854807B2

(12) United States Patent
Hoffmann et al.

(10) Patent No.: US 8,854,807 B2
(45) Date of Patent: Oct. 7, 2014

(54) CONVERTER ARRANGEMENT WITH AN AIR COOLING SYSTEM

(75) Inventors: Ingolf Hoffmann, Herzogenaurach (DE); Wolfgang Lottes, Nürnberg (DE)

(73) Assignee: Siemens Aktiengesellschaft, Munich (DE)

(*) Notice: Subject to any disclaimer, the term of this patent is extended or adjusted under 35 U.S.C. 154(b) by 217 days.

(21) Appl. No.: 13/564,306

(22) Filed: Aug. 1, 2012

(65) Prior Publication Data

US 2013/0039008 A1    Feb. 14, 2013

(30) Foreign Application Priority Data

Aug. 9, 2011   (EP) .................................. 11176933

(51) Int. Cl.
*H05K 7/20* (2006.01)
*F28F 7/00* (2006.01)
*H01L 23/34* (2006.01)
*H02M 7/00* (2006.01)

(52) U.S. Cl.
CPC .......... *H05K 7/20909* (2013.01); *H02M 7/003* (2013.01)
USPC ................... 361/679.5; 361/679.51; 361/697; 363/141; 165/80.3; 257/722; 174/548; 174/16.3

(58) Field of Classification Search
USPC ........ 361/679.46–679.54, 688–723; 363/141; 165/80.2–80.3; 257/712–713, 257/721–722; 174/16.3, 547, 548
See application file for complete search history.

(56) References Cited

U.S. PATENT DOCUMENTS

| 5,091,823 | A | * | 2/1992 | Kanbara et al. ............... 361/697 |
| 6,091,604 | A | * | 7/2000 | Plougsgaard et al. ......... 361/707 |
| 7,554,804 | B2 | * | 6/2009 | Kunkle ......................... 361/695 |
| 8,335,081 | B2 | * | 12/2012 | Weiss ............................ 361/694 |
| 8,379,384 | B2 | * | 2/2013 | Smalen et al. ............. 361/679.51 |
| 8,670,237 | B2 | * | 3/2014 | Hatai ............................ 361/715 |
| 2003/0079860 | A1 | | 5/2003 | Hoffmann et al. |
| 2004/0223301 | A1 | | 11/2004 | Müller et al. |
| 2012/0020021 | A1 | * | 1/2012 | Kishimoto et al. ............ 361/695 |

FOREIGN PATENT DOCUMENTS

| DE | 19618996 A1 | 11/1997 |
| DE | 10153748 A1 | 5/2003 |
| EP | 0356991 A2 | 3/1990 |
| WO | WO 2008071192 A1 | 6/2008 |

* cited by examiner

*Primary Examiner* — Zachary M Pape
(74) *Attorney, Agent, or Firm* — Henry M. Feiereisen LLC

(57) ABSTRACT

A converter arrangement includes a housing having a first cooling air channel, at least one capacitor disposed in the housing, a fan for generating a cooling air flow, and a first power electronics module disposed in the housing between the at least one capacitor and the fan, as viewed in a direction of the cooling air flow. The first power electronics module is positioned in relation to the fan so as to only be cooled by a first partial air flow. A second partial air flow provided for cooling the at least one capacitor is routed via the first cooling air channel past the first power electronics module such that the second partial air flow is thermally separated from the first power electronics module.

10 Claims, 5 Drawing Sheets

CONVERTER ARRANGEMENT WITH AN AIR COOLING SYSTEM

CROSS-REFERENCES TO RELATED APPLICATIONS

This application claims the priority of European Patent Application, Serial No. 11176933.7, filed Aug. 9, 2011, pursuant to 35 U.S.C. 119(a)-(d), the content of which is incorporated herein by reference in its entirety as if fully set forth herein.

BACKGROUND OF THE INVENTION

The present invention relates to a converter arrangement with an air cooling system.

The following discussion of related art is provided to assist the reader in understanding the advantages of the invention, and is not to be construed as an admission that this related art is prior art to this invention.

Air-cooled converters are generally known and widely feature an inverter, a DC voltage intermediate circuit capacitor and also a rectifier. A bus system establishes an electrical connection between the three converter elements.

Converter units may be cooled by a fan unit with a DC voltage intermediate circuit capacitor battery and a power module. A mounting frame for a cooling channel is constructed from metal plates, and the capacitor battery and the power module are disposed opposite each other each on a cooling device that can be equipped with components on both sides.

It would therefore be desirable and advantageous to obviate prior art shortcomings and to provide a converter arrangement with improved cooling.

SUMMARY OF THE INVENTION

According to one aspect of the present invention, a converter arrangement includes a housing having a first cooling air channel, at least one capacitor disposed in the housing, a fan for generating a cooling air flow, and a first power electronics module disposed in the housing between the at least one capacitor and the fan, as viewed in a direction of the cooling air flow, and being positioned in relation to the fan so as to only be cooled by a first partial air flow. A second partial air flow provided for cooling the at least one capacitor is routed via the first cooling air channel past the first power electronics module such that the second partial air flow is thermally separated from the first power electronics module.

The term power electronics module, in this context and in the document as a whole, includes both semiconductor power electronics components, especially power semiconductors or semiconductor switches, and also a heat sink provided for cooling them.

The separation of the cooling air flow into a first partial air flow and a second partial air flow allows the power electronics module to be cooled by the first, still cold partial air flow of the cooling air flow.

The second partial air flow of the cooling air flow supplies the at least one capacitor with cooling air that is still cold in that the second partial air flow is thermally separated by means of the first cooling air channel from the first power electronics module and thus has not yet been heated up.

Consequently both the first power electronics module and also the at least one capacitor are cooled by cooling air that is still cold, although the at least one capacitor, viewed in the direction of the cooling air flow, is disposed beyond the first power electronics module.

Since dissipated heat is created by power electronics modules, but a temperature that is too high shortens the life of the capacitors, the inventive converter arrangement has advantages over prior-art converter arrangements, especially in relation to the lifetime and the maximum ambient temperature. In addition a higher current carrying capacity is a further advantage obtained.

According to an advantageous feature of the present invention, a second cooling air channel disposed in the housing provided for the cooling of the first power electronics module may route the first partial air flow past the at least one capacitor such that it is thermally separated from the at least one capacitor.

The first partial air flow is heated up by the first power electronics module and, viewed in the direction of the cooling air flow, is routed past the first power electronics module to the at least one capacitor such that the at least one capacitor is supplied with cooling air that is still cold.

According to an advantageous feature of the present invention, additionally a second power electronics module may be provided which is disposed, in the direction of the cooling air flow, beyond the at least one capacitor.

Advantageously, merging means for merging the two partial air flows are provided, wherein the two merged partial air flows cool the second power electronics module.

According to another advantageous feature of the present invention, the merging means may be designed within the housing such that the two channels, as viewed in the direction of the cooling air flow, are combined beyond the at least one capacitor. The merging means can be realized by the two partial air flows flowing out of the channels and flowing into a common channel which can narrow in the direction of the cooling air flow. The merging means may advantageously be embodied in the form of a metal plate to guide the partial air flows.

According to another advantageous feature of the present invention, the fan, the first power electronics module, the at least one capacitor and finally the second power electronics module may be disposed sequentially in the direction of the cooling air flow. This allows a direct linear electrical bus bar arrangement of the three aforementioned electrical units in the direction of the electrical current flow and avoids any looping of the electrical bus bar. The direct linear electrical bus bar allows a reduced bus bar outlay and offers the particular advantage of enabling savings in material to be made. Because of the relatively high costs, especially for copper bus bars, significant cost savings are produced thanks to the reduced bus bar outlay. A further advantage is that the at least one capacitor and also the first power electronics module will still be cooled with fresh cool air.

According to another advantageous feature of the present invention, the converter arrangement may be a DC voltage intermediate circuit converter which can be operated at higher ambient temperature due to the improved cooling.

According to another advantageous feature of the present invention, the first power electronics module may be an inverter and the at least one capacitor may be a DC voltage intermediate circuit capacitor. In particular, semiconductor components, especially power semiconductors or semiconductor switches such as IGBTs or other transistors as well as freewheeling diodes for example, may advantageously be used for the inverter. The capacitors may for example be embodied as electrolytic capacitors, dual-layer capacitors or the like.

According to another advantageous feature of the present invention, the second power electronics module may be embodied as a rectifier. Advantageously, the rectifier may be designed as a bridge rectifier with diodes, since bridge rectifiers with diodes, by comparison with inverters with power semiconductors, tend to generate less dissipated heat and thus need less cooling power. Therefore, the cooling air already preheated by the electrical units disposed upstream in the direction of the cooling air flow can be used for cooling the rectifier. Alternatively, a rectifier equipped with semiconductor components, especially power semiconductors or semiconductor switches such as IGBTs or other transistors as well as freewheeling diodes, which allows for a four-quadrant operation, may be used.

According to another advantageous feature of the present invention, the converter arrangement may include a braking unit with a braking chopper and at least one braking resistor. For example, the at least one braking resistor, as viewed in the direction of the cooling air flow, can be disposed beyond the at least one capacitor. The at least one breaking resistor can then be cooled by only one of the partial air flows, by both partial air flows together or by a third partial air flow which is routed parallel to the second air flow.

According to another advantageous feature of the present invention, the first power electronics module may include semiconductor components and a heat sink provided for cooling the semiconductor components.

Semiconductor components are especially well suited for power electronics, with the dissipation of the heat loss occurring in the semiconductor components being enhanced by the heat sink.

According to another advantageous feature of the present invention, the heat sink may be arranged in relation to the cooling air flow such that the first partial air flow flows through it. In this case the second partial air flow is conveyed by the first cooling air channel past the heat sink such that the second partial air flow is thermally separated from the heat sink.

This arrangement allows excellent cooling of the first power electronics module by the heat sink and simultaneously allows the at least one capacitor to be supplied with fresh cooling air by the second partial air flow which is thermally separated from the first power electronics module.

According to another advantageous feature of the present invention, the housing may include at least one housing part which has at least one inflow opening for introducing the second partial air flow and an outflow opening for venting the second partial air flow and which at least partly surrounds the at least one capacitor while forming a cooling air gap between the at least one capacitor and the housing part.

The second partial air flow enters the housing part through the inflow opening, is directed by the housing part along in the cooling air gap to the at least one capacitor for the purposes of cooling it and finally leaves the housing part through the outflow opening. The housing part thus allows efficient cooling of the at least one capacitor and simultaneously a thermal separation of the second partial air flow from the first partial air flow.

According to another advantageous feature of the present invention, the at least one capacitor may be arranged in the direction of the cooling air flow in rows, together with a number of capacitors. The housing part hereby at least partly surrounds a corresponding row such that the second cooling air channel is formed between the rows, through which the first partial air flow is routed past to the capacitors.

Arranging the capacitors in rows along with the cooling air flow produces advantageous flow characteristics for the second cooling air channel, ensuring at the same time the second partial air flow to cool the capacitors.

Advantageously, the first cooling air channel through which the second partial air flow flows may be formed by the housing of the converter arrangement and a housing element which delimits the heat sink of the first power electronics module. For example, the housing element may divide the cooling air flow coming from the fan into at least the first partial air flow and the second partial air flow.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
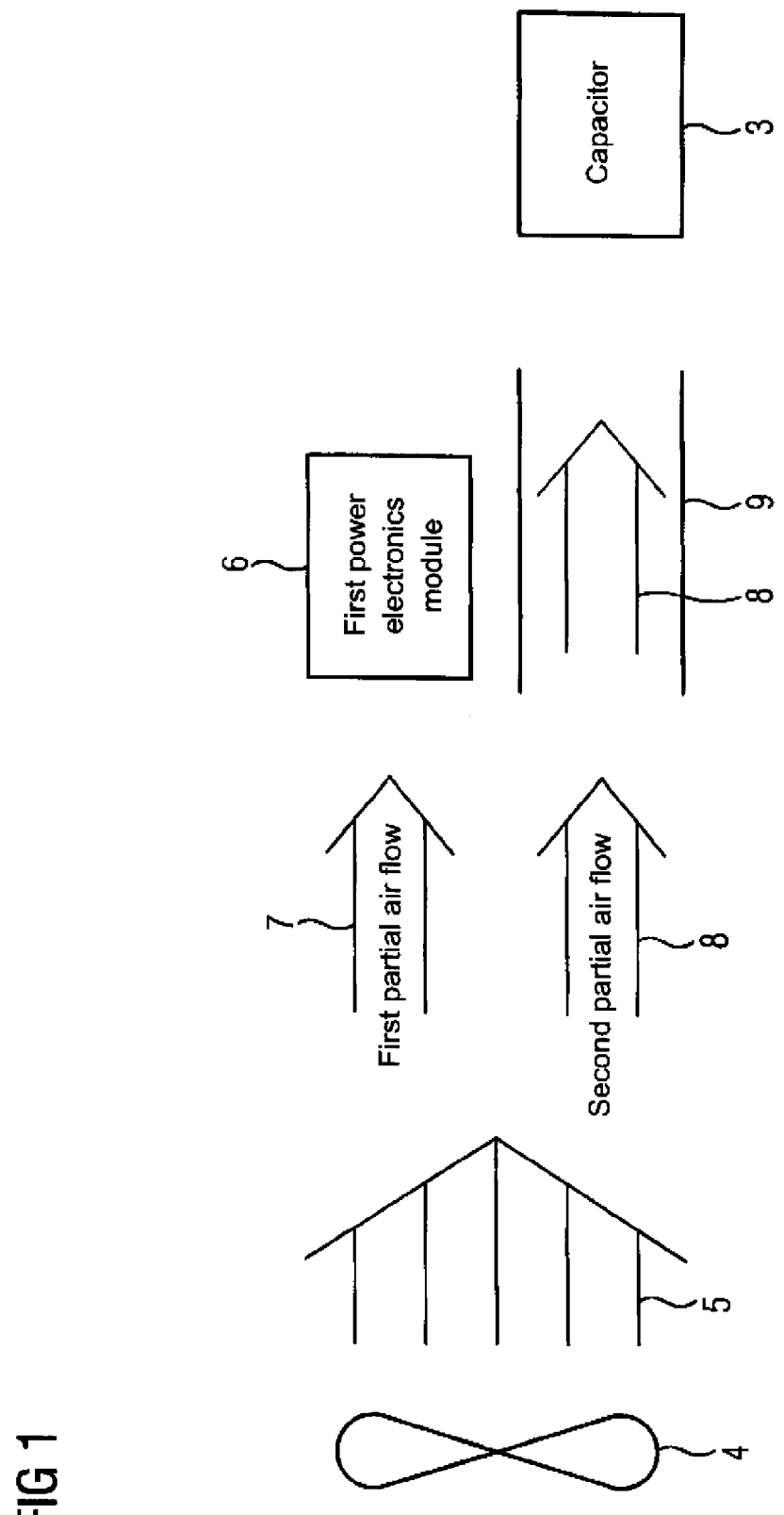
FIG. 1 shows a basic diagram of a converter arrangement according to the present invention.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a basic diagram of a converter arrangement according to the present invention with a first power electronics module 6 and a capacitor 3. A fan 4 generates a cooling air flow 5, with the capacitor 3 being disposed in the direction of the cooling air flow 5 beyond the first power electronics module 6.

The first power electronics module 6 is positioned so that it is only cooled by a first partial air flow 7 of the cooling air flow 5. A second partial air flow 8 of the cooling air flow 5 cools the capacitor 3. A first cooling air channel 9 in this case routes the second partial air flow 8 past the first power electronics module 6 such that the second partial air flow is thermally separated from the first power electronics module.

Figure 2:
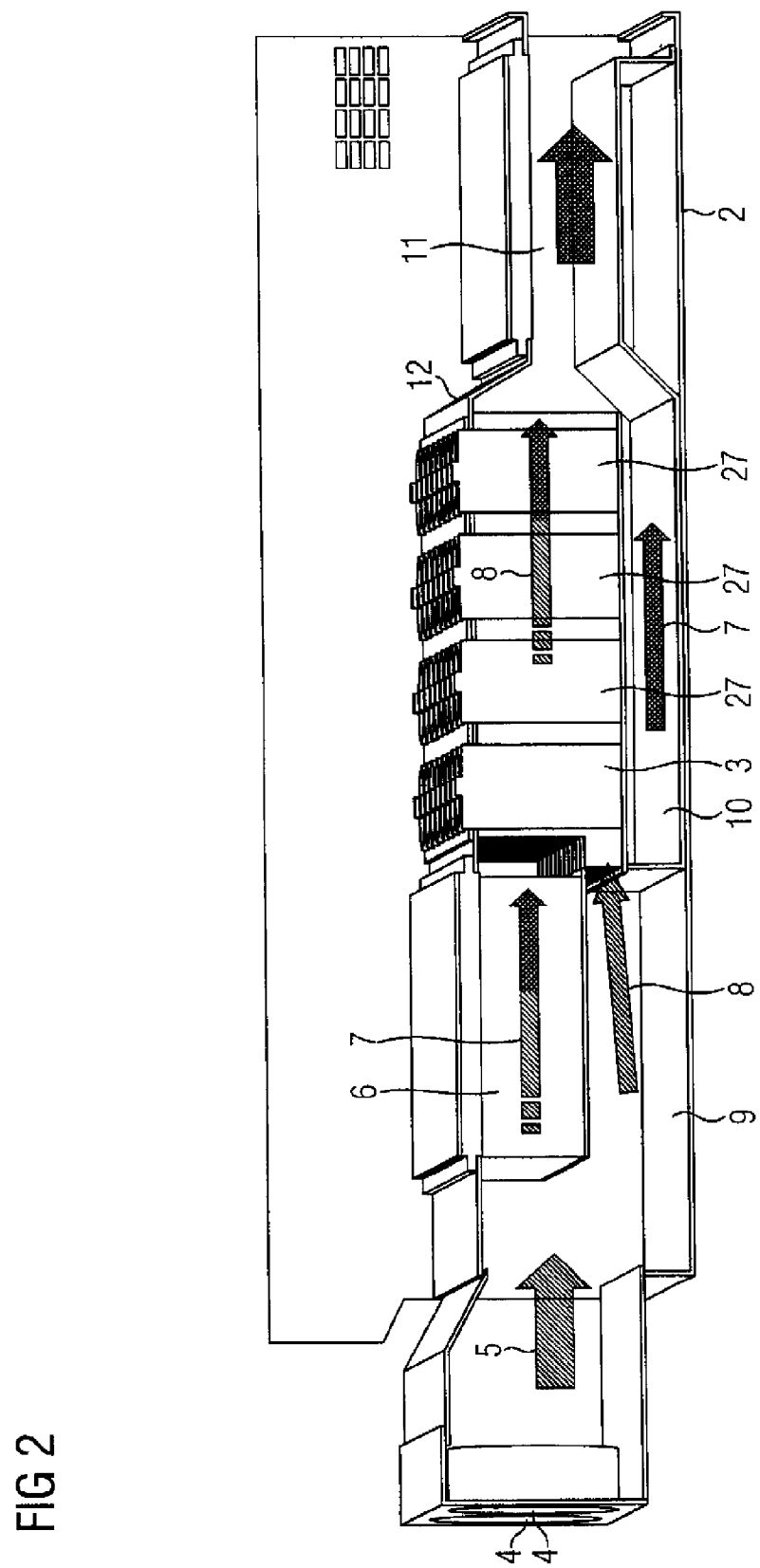
FIG. 2 shows a first embodiment of the converter arrangement according to the present invention.

FIG. 2 shows a first embodiment of the inventive inverter arrangement, with two fans 4 disposed next to one another generating a cooling air flow 5. Disposed in the direction of the cooling air flow 5 within a housing 2 are sequentially a first power electronics module 6, a capacitor 3 and further capacitors 27, and finally a second power electronics module 11. The first power electronics module 6 includes a heat sink able to be seen in the figure and semiconductor components not shown in the figure.

The cooling air flow 5 is divided up into a first partial air flow 7 and a second partial air flow 8, with the first partial air flow 7 cooling the first power electronics module 6 and the second partial air flow 8 cooling the capacitor 3 and the further capacitors 27.

The second partial air flow 8 is initially routed in a bypass through the first cooling air channel 9 past the first power electronics module 6 and as a result of the separation effected by the bypass does not accept any of the heat generated by the first power electronics module 6 in this case. Subsequently the second partial air flow 8 cools the capacitor 3 and the further capacitors 27 and, in doing so, is heated up.

The first partial air flow 7 initially cools the first power electronics module 6 and is heated up by this process. It is then routed past capacitor 3 and the further capacitors 27 in a further bypass in the form of a second cooling air channel 10, with the capacitor 3 and the further capacitors 27, because of the thermal separation from the first partial air flow 7, not being heated up by said air flow.

Merging means 12 for merging the two partial air flows 7 and 8 are embodied in this embodiment such that the first partial air flow 7 is routed in the second cooling air channel 10 in the direction of the cooling air flow 5 until the second cooling air channel ends and the first partial air flow 7 is combined with the second partial air flow 8 which has cooled the capacitor 3 and the further capacitors 27. In this case, the merging means 12 for merging the two partial air flows 7 and 8 include a narrowing of the channel in which the two merged partial air flows 7 and 8 are moving. The two merged partial air flows 7 and 8 finally cool the second power electronics module 11.

Figure 3:
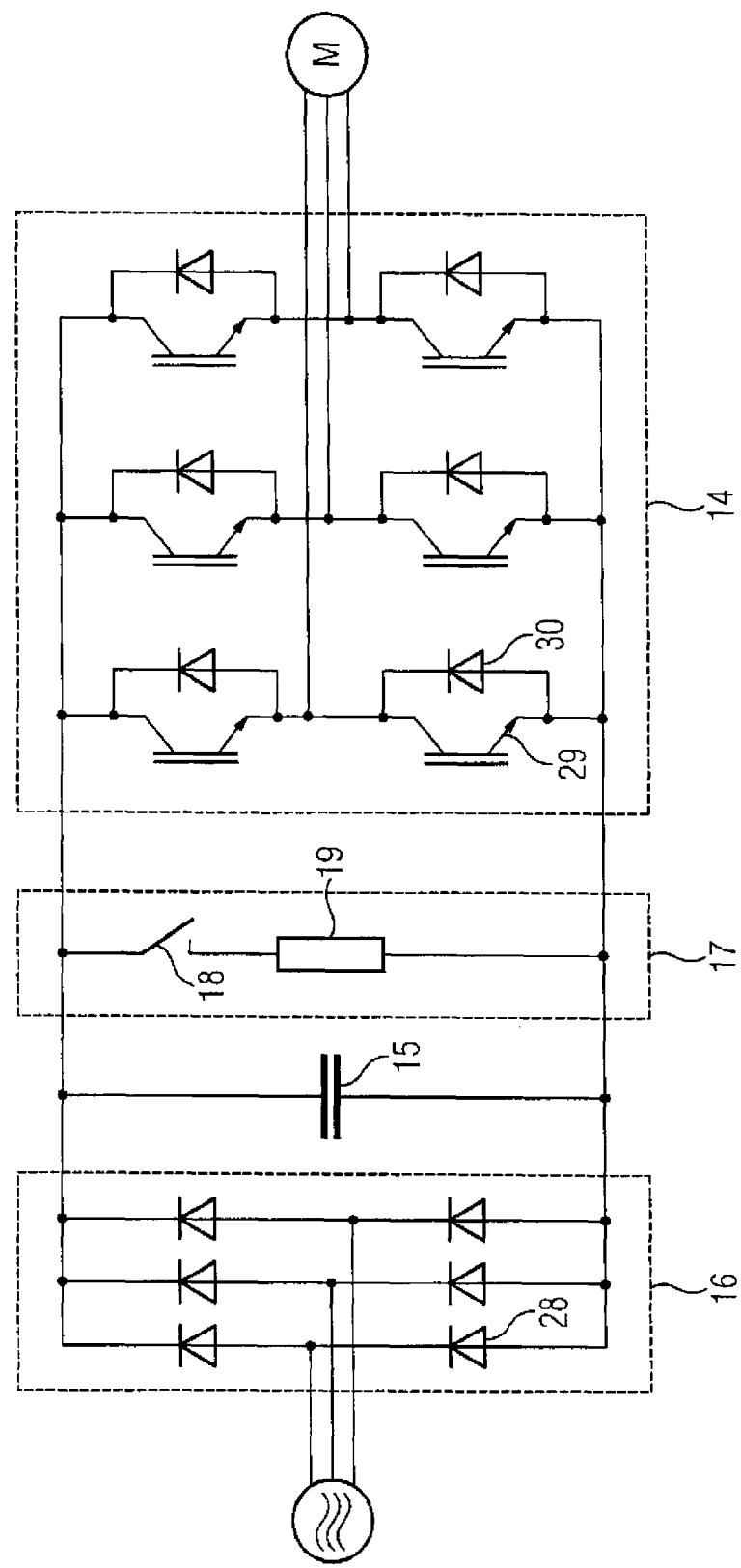
FIG. 3 shows an electrical circuit diagram of a further embodiment of the converter arrangement according to the present invention.

FIG. 3 shows an electrical circuit diagram of a further embodiment of the inventive converter arrangement which is embodied as a DC voltage intermediate circuit converter. An AC mains-side three-phase alternating current is first rectified by rectifier diodes 28 of a rectifier 16 and supplies a DC voltage intermediate circuit capacitor 15. The DC voltage intermediate circuit voltage is converted in an inverter 14 with the aid of transistors 29 and freewheeling diodes 30 into a three-phase AC voltage, for example for supplying a load M.

This arrangement has a braking unit 17, which is located between DC voltage intermediate circuit capacitor 15 and inverter 14. The braking unit 17 connects the two poles of the DC voltage intermediate circuit capacitor 15 via a braking chopper 18 and a braking resistor 19.

Figure 4:
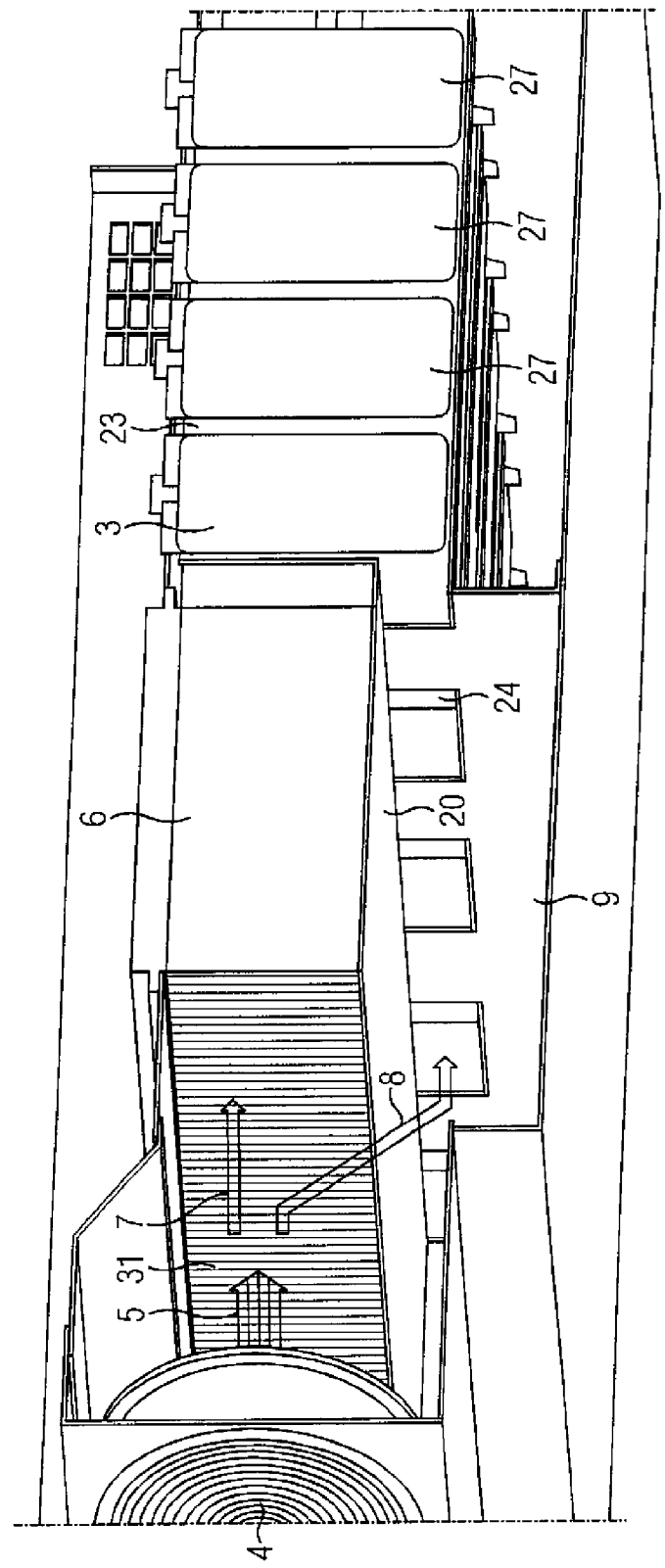
FIG. 4 shows a section of the first embodiment of the converter arrangement according to the present invention.

FIG. 4 shows a section of the first exemplary embodiment of the inventive converter arrangement. A heat sink 31 is provided for cooling the first power electronics module 6 and is delimited at the bottom by a housing element 20 which divides the cooling air flow 5 coming from the fans 4 into the first partial air flow 7 and the second partial air flow 8. The first partial air flow 7 flows above the housing element 20 through the heat sink and transports away the heat loss occurring in the first power electronics module 6.

The second partial air flow 8 flows below the housing element 20 in the first cooling air channel 9 past the first power electronics module 6. In this case the second partial air flow 8 is thermally separated by the housing element 20 from the first power electronics module 6 and flows via an inflow opening 24 for introducing the second partial air flow 8 into a housing part 23, which at least partly surrounds the capacitor 3 and the further capacitors 27.

Figure 5:
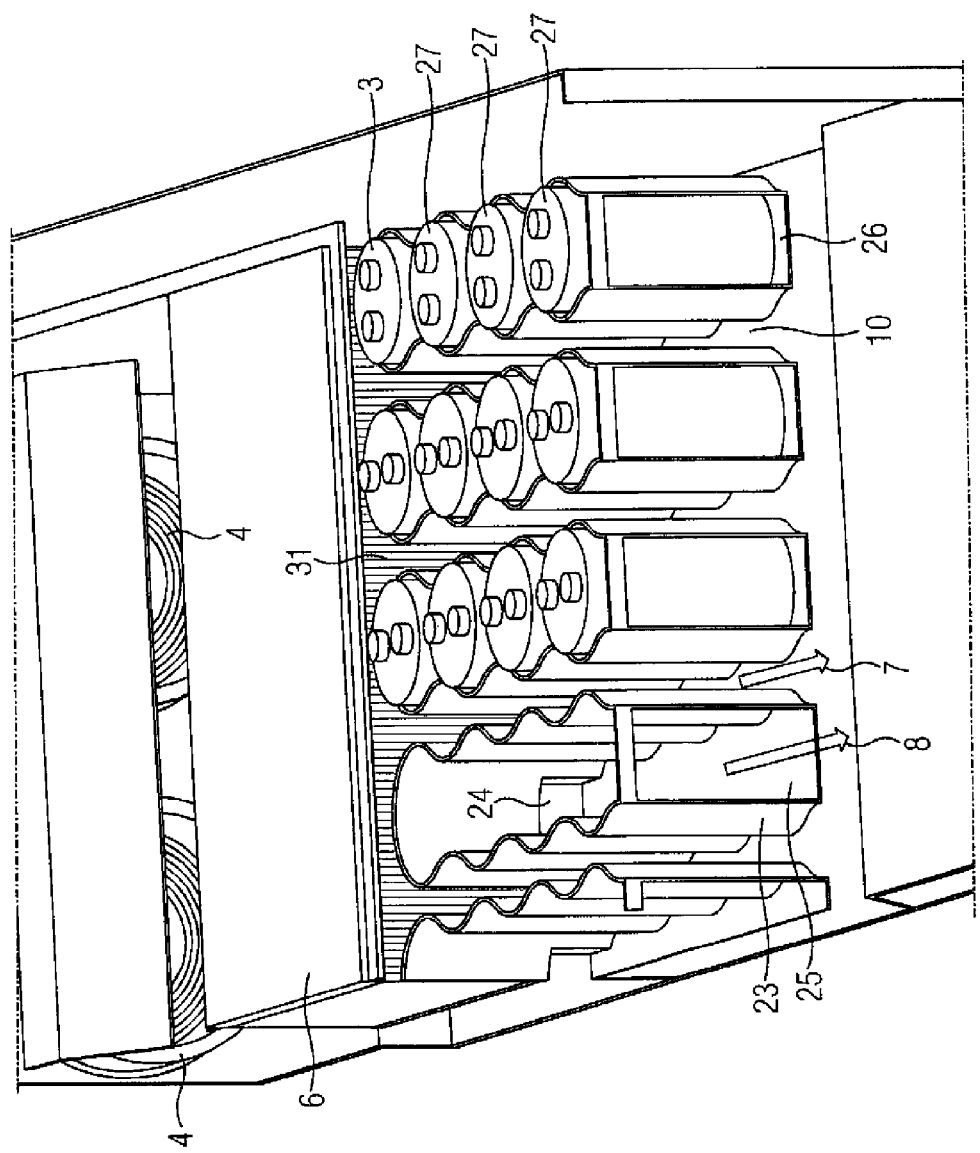
FIG. 5 shows a further section of the first embodiment of the converter arrangement according to the present invention.

FIG. 5 shows a further section of the first embodiment of the inventive converter arrangement.

The second partial air flow 8 enters through the inflow opening 24 for introducing the second partial air flow 8 into the housing parts 23 and exits through an outflow opening 25 for venting the second partial air flow 8. The capacitor 3 and the further capacitors 27 are disposed in rows in the direction of the partial air flows 7, 8, with the rows having the same structure. Simply to make it easier to understand the diagram depicted in FIG. 5, the capacitors 3, 27 are hidden in one of the rows. The capacitor 3 and the further capacitors 27 are partly surrounded by the housing part 23, with a cooling air gap 26 being left, through which the second partial air flow 8 flows. The cooling air gap 26 can be embodied in the shape of a cone in order to enhance the free flow around the cylindrical capacitors 3, 27 of fresh air which comes from the inflow opening 24 for introducing the second partial air flow 8.

The first partial air flow 7 flows through the heat sink 31 of the first power electronics module 6. Subsequently the first partial air flow 7 is conveyed in the second cooling air channel 10 along the housing parts 23, with the second cooling air channel 10 being delimited by the housing part of two adjacent rows, in which the capacitors 3, 27 are disposed. In this case the first partial air flow 7 is thermally separated from the capacitor 3 and the further capacitors 27.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed is:

1. A converter arrangement comprising:
   a housing having a first cooling air channel,
   at least one capacitor disposed in the housing,
   a fan for generating a cooling air flow, and
   a first power electronics module disposed in the housing between the at least one capacitor and the fan, as viewed in a direction of the cooling air flow, and being positioned in relation to the fan so as to be cooled only by a first partial air flow,
   wherein a second partial air flow provided for cooling the at least one capacitor is routed via the first cooling air channel past the first power electronics module such that the second partial air flow is substantially thermally separated from the first power electronics module,
   wherein the housing comprises a second cooling air channel, and wherein the first partial air flow is routed via the second cooling air channel past the at least one capacitor such that the first partial air flow is substantially thermally separated from the at least one capacitor.

2. The converter arrangement of claim 1, wherein the housing comprises at least one housing part having at least one inflow opening for introducing the second partial air flow and an outflow opening for venting the second partial air flow, said at least one housing part at least partly surrounding the at least one capacitor and forming a cooling air gap between the at least one capacitor and the at least one housing part.

3. The converter arrangement of claim 2, wherein the at least one capacitor in conjunction with a plurality of additional capacitors is disposed in rows, as viewed in the direction of the cooling air flow, wherein the at least one housing part at least partly encloses a corresponding row of the additional capacitors such that a second cooling air channel is formed between the rows, through which the first partial air flow is routed past the at least one capacitor and the additional capacitors.

4. A converter arrangement comprising:
a housing having a first cooling air channel,
at least one capacitor disposed in the housing,
a fan for generating a cooling air flow,
a first power electronics module disposed in the housing between the at least one capacitor and the fan, as viewed in a direction of the cooling air flow, and being positioned in relation to the fan so as to be cooled only by a first partial air flow, wherein a second partial air flow provided for cooling the at least one capacitor is routed via the first cooling air channel past the first power electronics module such that the second partial air flow is substantially thermally separated from the first power electronics module,
a second power electronics module disposed distal of the at least one capacitor, as viewed in the direction of the cooling air flow, and
merging means for merging the first and second partial air flows, with the merged first and second partial air flows being provided for cooling the second power electronics module.

5. The converter arrangement of claim 4, wherein the second power electronics module is a rectifier.

6. A converter arrangement comprising:
a housing having a first cooling air channel,
at least one capacitor disposed in the housing,
a fan for generating a cooling air flow, and
a first power electronics module disposed in the housing between the at least one capacitor and the fan, as viewed in a direction of the cooling air flow, and being positioned in relation to the fan so as to be cooled only by a first partial air flow,
wherein a second partial air flow provided for cooling the at least one capacitor is routed via the first cooling air channel past the first power electronics module such that the second partial air flow is substantially thermally separated from the first power electronics module,
wherein the converter arrangement is constructed as a DC voltage intermediate circuit converter.

7. A converter arrangement comprising:
a housing having a first cooling air channel,
at least one capacitor disposed in the housing,
a fan for generating a cooling air flow, and
a first power electronics module disposed in the housing between the at least one capacitor and the fan, as viewed in a direction of the cooling air flow, and being positioned in relation to the fan so as to be cooled only by a first partial air flow,
wherein a second partial air flow provided for cooling the at least one capacitor is routed via the first cooling air channel past the first power electronics module such that the second partial air flow is substantially thermally separated from the first power electronics module,
wherein the first power electronics module is an inverter and the at least one capacitor is a DC voltage intermediate circuit capacitor.

8. A converter arrangement comprising:
a housing having a first cooling air channel,
at least one capacitor disposed in the housing,
a fan for generating a cooling air flow,
a first power electronics module disposed in the housing between the at least one capacitor and the fan, as viewed in a direction of the cooling air flow, and being positioned in relation to the fan so as to be cooled only by a first partial air flow, wherein a second partial air flow provided for cooling the at least one capacitor is routed via the first cooling air channel past the first power electronics module such that the second partial air flow is substantially thermally separated from the first power electronics module, and
a braking unit comprising a braking chopper and at least one braking resistor, wherein the at least one braking resistor is cooled by at least one of the first and second partial air flows.

9. A converter arrangement comprising:
a housing having a first cooling air channel,
at least one capacitor disposed in the housing,
a fan for generating a cooling air flow, and
a first power electronics module disposed in the housing between the at least one capacitor and the fan, as viewed in a direction of the cooling air flow, and being positioned in relation to the fan so as to be cooled only by a first partial air flow,
wherein a second partial air flow provided for cooling the at least one capacitor is routed via the first cooling air channel past the first power electronics module such that the second partial air flow is substantially thermally separated from the first power electronics module,
wherein the first power electronics module comprises semiconductor components and a heat sink for cooling the semiconductor components.

10. The converter arrangement of claim 9, wherein the heat sink is disposed in the first partial air flow and the second partial air flow is routed so as to bypass the heat sink and thermally separated from the heat sink.

* * * * *